US012695049B2

(12) United States Patent (10) Patent No.: US 12,695,049 B2
Yoo et al. (45) Date of Patent: Jul. 28, 2026

(54) ION BEAM DEPOSITION APPARATUS AND ION BEAM DEPOSITION METHOD USING THE SAME

(71) Applicant: SAMSUNG ELECTRONICS CO., LTD., Suwon-si (KR)

(72) Inventors: SeungWan Yoo, Suwon-si (KR); Jeongyeon Lee, Suwon-si (KR); Dohyung Kim, Suwon-si (KR); Jaehong Park, Suwon-si (KR); Dong-Chan Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 349 days.

(21) Appl. No.: 18/226,644

(22) Filed: Jul. 26, 2023

(65) Prior Publication Data

US 2024/0071712 A1 Feb. 29, 2024

(30) Foreign Application Priority Data

Aug. 30, 2022 (KR) ........................ 10-2022-0109013

(51) Int. Cl.
*H01J 37/20* (2006.01)
*H01J 37/317* (2006.01)
(52) U.S. Cl.
CPC .......... *H01J 37/20* (2013.01); *H01J 37/3178* (2013.01); *H01J 2237/201* (2013.01); *H01J 2237/20214* (2013.01)
(58) Field of Classification Search
CPC .. H01J 37/00; H01J 37/02; H01J 37/20; H01J 37/3178; H01J 37/34; H01J 37/023; H01J 2237/3146; H01J 2237/20214; H01J 2237/201; C23C 14/46; C23C 14/3407; C23C 14/221; C23C 14/165
USPC ...................................................... 250/442.11
See application file for complete search history.

(56) References Cited

U.S. PATENT DOCUMENTS

| | | | | |
|---|---|---|---|---|
| 6,063,436 A | * | 5/2000 | Pavell | .................... C23C 14/46 |
| | | | | 427/561 |
| 7,588,669 B2 | | 9/2009 | Guo | |
| 9,988,711 B2 | | 6/2018 | Likhanskii | |
| 2012/0080308 A1 | * | 4/2012 | Kameyama | ......... C23C 14/3442 |
| | | | | 204/298.04 |
| 2018/0350559 A1 | * | 12/2018 | Matsushita | ............. H01J 37/08 |
| 2020/0165716 A1 | * | 5/2020 | Nose | .................... C23C 14/355 |

FOREIGN PATENT DOCUMENTS

| | | | |
|---|---|---|---|
| JP | 5-65637 | A | 3/1993 |
| JP | 2001-295038 | A | 10/2001 |
| JP | 2004-68100 | A | 3/2004 |
| JP | 2004-285424 | A | 10/2004 |
| JP | 4041780 | B2 | 1/2008 |
| KR | 10-1340616 | B1 | 12/2013 |

* cited by examiner

*Primary Examiner* — Jason L Mccormack
(74) *Attorney, Agent, or Firm* — Sughrue Mion, PLLC

(57) ABSTRACT

An ion beam deposition method includes placing a substrate into an ion beam deposition apparatus, irradiating an ion beam from an ion beam source toward a target plate, and rotating the target plate during the irradiating of the ion beam. The target plate includes a first region that includes a first material, and a second region that includes a second material different from the first material.

8 Claims, 10 Drawing Sheets

ION BEAM DEPOSITION APPARATUS AND ION BEAM DEPOSITION METHOD USING THE SAME

CROSS-REFERENCE TO RELATED APPLICATION

This application claims priority to Korean Patent Application No. 10-2022-0109013, filed on Aug. 30, 2022, in the Korean Intellectual Property Office, the disclosure of which is incorporated by reference herein in its entirety.

BACKGROUND

The disclosure relates to an ion beam deposition apparatus and an ion beam deposition method using the same, and more particularly, to an ion beam deposition apparatus capable of forming a deposition layer on a substrate by using a plurality of constituents and an ion beam deposition method using the same.

A semiconductor device may be fabricated by using various processes. For example, the semiconductor device may be manufactured by allowing a silicon wafer to undergo a photolithography process, an etching process, a deposition process, and so forth. The deposition process may employ an ion beam deposition apparatus in which an ion beam is used. In an ion beam deposition process, an ion beam may be irradiated to a target including a specific constituent. When the ion beam is irradiated to the target, the specific constituent may come out to move onto a substrate. The specific constituent sputtered toward the substrate may be deposited on the substrate. Such ion beam deposition process may form a deposition layer on the substrate.

SUMMARY

One or more example embodiments provide an ion beam deposition apparatus capable of forming a single deposition layer including a plurality of materials and an ion beam deposition method using the same.

According to an aspect of an example embodiment, an ion beam deposition method includes: placing a substrate into an ion beam deposition apparatus; irradiating an ion beam from an ion beam source toward a target plate; and rotating the target plate during the irradiating the ion beam, wherein the target plate comprises a first region comprising a first material and a second region comprising a second material different from the first material.

According to an aspect of an example embodiment, an ion beam deposition method includes: placing a substrate onto a substrate holder; irradiating an ion beam toward a target plate spaced apart from the substrate holder; and rotating the substrate during the irradiating the ion beam toward the target plate, wherein the target plate comprises: a first region; and a second region that is non-overlapping with the first region, and wherein the first region comprises a material different from a material of the second region.

According to an aspect of an example embodiment, an ion beam deposition apparatus, includes: an ion beam source; a target part spaced apart from the ion beam source; and a substrate holder spaced apart from each of the ion beam source and the target part, wherein the target part comprises a target plate and a target holder that supports the target plate, wherein the target plate comprises a plurality of first regions each comprising a first material and a plurality of second regions each comprising a second material different from the first material, and wherein each of the plurality of first regions and each of the plurality of second regions are alternately disposed in a circumferential direction.

BRIEF DESCRIPTION OF DRAWINGS

The above and other aspects and features will be more apparent from the following description of example embodiments, taken in conjunction with the accompanying drawings, in which.

DETAILED DESCRIPTION OF EMBODIMENTS

Figure 1:
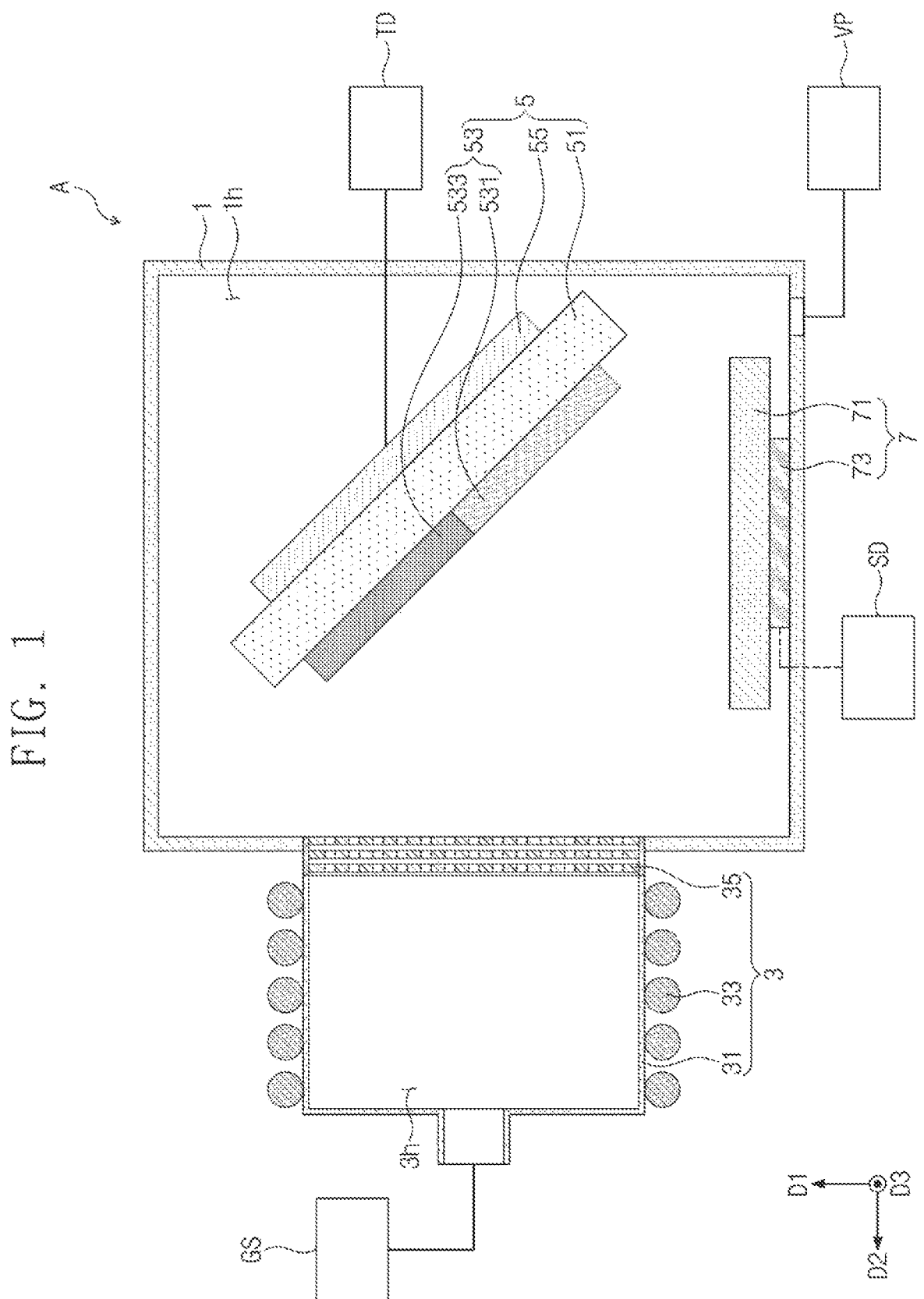
FIG. 1 illustrates a cross-sectional view showing an ion beam deposition apparatus according to example embodiments.

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Like reference numerals may indicate like components throughout the description.

FIG. 1 illustrates a cross-sectional view showing an ion beam deposition apparatus according to example embodiments.

In the description of example embodiments, symbol D1 may indicate a first direction, symbol D2 may indicate a second direction that intersects the first direction D1, and symbol D3 may indicate a third direction that intersects each of the first direction D1 and the second direction D2.

Referring to FIG. 1, an ion beam deposition apparatus A may be provided. The ion beam deposition apparatus A may be a device that forms a deposition layer on a substrate. For example, the ion beam deposition apparatus A may use an ion beam to form a deposition layer on a substrate. The ion beam deposition apparatus A may be configured such that an ion beam may be used to sputter a target material from a target plate, and such that the target material may be deposited on a substrate. In an example embodiment, the substrate may be a silicon (Si) wafer, but example embodiments are not limited thereto. The ion beam deposition apparatus A may include a chamber 1, an ion beam source 3, a target part 5, a substrate support 7, a gas supply GS, a substrate driver SD, a target driver TD, and a vacuum pump VP. The target part 5 may also be referred to as a target 5.

The chamber 1 may provide a process space 1h. The chamber 1 may envelope the target part 5 and the substrate support 7 such that the target part 5 and the substrate support 7 are disposed in the chamber 1 in the process space 1h. The process space 1h may be substantially maintained at a vacuum during an ion beam deposition process.

The ion beam source 3 may irradiate an ion beam. For example, the ion beam source 3 may generate a plasma to extract an ion beam from the plasma. An ion beam created from the ion beam source 3 may be irradiated to the target part 5. The ion beam source 3 may include a plasma chamber 31, a plasma generator 33, and a grid 35.

The plasma chamber 31 may provide a plasma generation space 3h. The plasma chamber 31 may be associated with one side of the chamber 1. The example embodiments, however, are not limited thereto, and, for example, the plasma chamber 31 may be positioned within the chamber 1. In other embodiments, the plasma chamber 31 and the chamber 1 may be disposed spaced apart from each other at a certain interval. The plasma generation space 3h may be connected to the process space 1h. For example, the plasma generation space 3h may be connected through the grid 35 to the process space 1h. A detailed description thereof will be further discussed below.

The plasma generator 33 may be associated with the plasma chamber 31. The plasma generator 33 may have, for example, a radio-frequency coil shape as illustrated in FIG. 1. In this case, the plasma generator 33 may surround an outer surface of the plasma chamber 31. The plasma generator 33 may generate an electric field and/or a magnetic field in the plasma generation space 3h. Therefore, a plasma may be formed or converted from at least a portion of gas in the plasma generation space 3h.

The grid 35 may be associated with one side of the process chamber 31. The grid 35 may be positioned between the plasma chamber 31 and the chamber 1. The grid 35 may provide a through hole (not designated by a reference numeral). The plasma generation space 3h and the process space 1h may be connected to each other via the through hole of the grid 35. The grid 35 may be provided in plural. The plurality of grids 35 may be disposed to overlap each other. A single grid 35 will be discussed below for convenience.

The target part 5 may be spaced apart from the ion beam source 3. For example, as shown in FIG. 1, the target 5 may be spaced apart in the second direction D2 from the ion beam source 3. The target part 5 may turn. A detailed description thereof will be further discussed below. The target part 5 may include a target holder 51, a target plate 53, and a target holder rotating device 55.

The target holder 51 may support the target plate 53. For example, the target holder 51 may secure or hold the target plate 53 in a certain or fixed position in the process space 1h such that the target plate 53 is rigidly held in place. The target holder 51 and the target plate 53 may be associated with each other through a coupling means such as a bolt so as to couple the target plate 53 to the target holder 51, but example embodiments are not limited thereto. The target holder 51 may turn about an axis through the target holder 51. For example, the target holder 51 may rotate on its own axis and the axis may be a central axis. A detailed description thereof will be further discussed below.

The target plate 53 may be associated with the target holder 51. The target plate 53 may include a target material. For example, the target plate 53 may include a deposition material that will be formed on a substrate placed on the substrate support 7. The target plate 53 may include a plurality of materials. The plurality of materials may be disposed without overlapping each other on the target plate 53 so that they are non-overlapping. For example, a first region 531 may refer to a zone where a first material is disposed. A second region 533 may refer to a zone where a second material is disposed. In an example embodiment, the first region 531 and the second region 533 may be separate from one another and may not overlap. The second material may be different from the first material. A detailed description thereof will be further discussed below with reference to FIG. 2.

The target holder rotating device 55 may turn the target holder 51. The target holder rotating device 55 may include an actuator such as a motor.

The substrate support 7 may be spaced apart from each of the ion beam source 3 and the target part 5. For example, as illustrated in FIG. 1, the substrate support 7 may be spaced apart in the first direction D1 from the target part 5. The substrate support 7 may secure or hold a substrate in a certain or fixed position in the process space 1h such that it is rigidly held in place. The substrate support 7 may include a substrate holder 71 and a substrate holder rotating device 73.

The substrate holder 71 may support a substrate. The substrate holder 71 may hold a substrate in various ways. For example, the substrate holder 71 may include an electrostatic chuck (ESC) and/or a vacuum chuck. The example embodiments, however, are not limited thereto, and a substrate may be disposed on the substrate hold without separate adhesion force on the substrate holder 71.

The substrate holder rotating device 73 may turn the substrate holder 71. The substrate holder rotating device 73 may include an actuator such as a motor.

The gas supply GS may supply the plasma generation space 3h with gas. The gas supply GS may include one or more of a gas tank, a compressor, a pipe, and a valve.

The substrate driver SD may turn the substrate support 7. For example, the substrate driver SD may provide the substrate holder rotating device 73 with rotating power to cause the substrate holder rotating device 73 to turn the substrate holder 71.

The target driver TD may turn the target part 5. For example, the target driver TD may provide the target holder rotating device 55 with rotating power to cause the target holder rotating device 55 to turn the target holder 51.

The vacuum pump VP may be connected to the process space 1h. The vacuum pump VP may allow the process space 1h to maintain a substantial vacuum during an ion beam deposition process.

Figure 2:
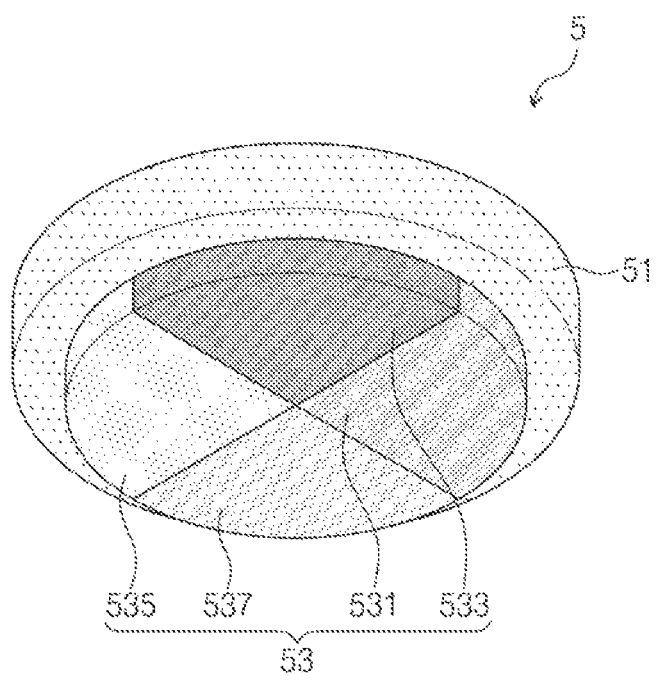
FIG. 2 illustrates a perspective view showing a target part according to example embodiments.

FIG. 2 illustrates a perspective view showing a target part according to example embodiments.

Referring to FIG. 2, the target plate 53 may have a disk shape. The target plate 53 may include a material that will be deposited on a substrate. The target plate 53 may include a plurality of materials. Therefore, a deposition layer made of the plurality of materials may be formed on a substrate. The target plate 53 may include a first region 531, a second region 533, a third region 535, and a fourth region 537.

The first region 531 may include a first material. In some embodiments, the target plate 53 may have the first region 531 indicating a zone made of the first material. The first region 531 may have a fan shape, but example embodiments are not limited thereto.

The second region 533 may include a second material. The second material may be distinguished from the first material. For example, the second material may be different from the first material. In an embodiment, the second region 533 may not overlap the first region 531. For example, when viewed in plan, the second region 533 and the first region 531 may not overlap each other. The second region 533 may have a fan shape, but example embodiments are not limited thereto.

The third region 535 may include a third material. The third material may be distinguished from each of the first material and the second material. For example, the third material may be different from each of the first material and the second material. The third region 535 may not overlap any of the first region 531 and the second region 533. For example, when viewed in plan, the third region 535 may overlap none of the first region 531 and the second region 533 so that the first region 531, the second region 533 and the third region 535 are each separate non-overlapping regions. The third region 535 may have a fan shape, but example embodiments are not limited thereto.

The fourth region 537 may include a fourth material. The fourth material may be distinguished from each of the first to third materials. For example, the fourth material may be different from each of the first to third materials. The fourth region 537 may not overlap any of the first region 531, the second region 533, and the third region 535. For example, when viewed in plan, the third region 537 may overlap none of the first region 531, the second region 533, and the third region 535 so that the first region 531, the second region 533, the third region 535 and the fourth region 537 are each separate non-overlapping regions. The fourth region 537 may have a fan shape, but example embodiments are not limited thereto.

In some embodiments, each of the first to fourth materials may include at least one selected from silicon (Si), tungsten (W), cobalt (Co), copper (Cu), aluminum (Al), ruthenium (Ru), molybdenum (Mo), hafnium (Hf), titanium (Ti), lanthanum (La), indium (In), tin (Sn), germanium (Ge), arsenic (As), tellurium (Te), selenium (Se), Praseodymium (Pr), and polyimide. Example embodiments, however, are not limited thereto.

In some embodiments, the first region 531, the second region 533, the third region 535, and the fourth region 537 may have substantially the same area. For example, each of the first, second, third, and fourth regions 531, 533, 535 and 537 may have a quarter-circular shape when viewed in plan.

Example embodiments, however, are not limited thereto, and the first, second, third, and fourth regions 531, 533, 535 and 537 may have different areas from each other. A detailed description thereof will be further discussed below with reference to FIG. 11.

Figure 3:
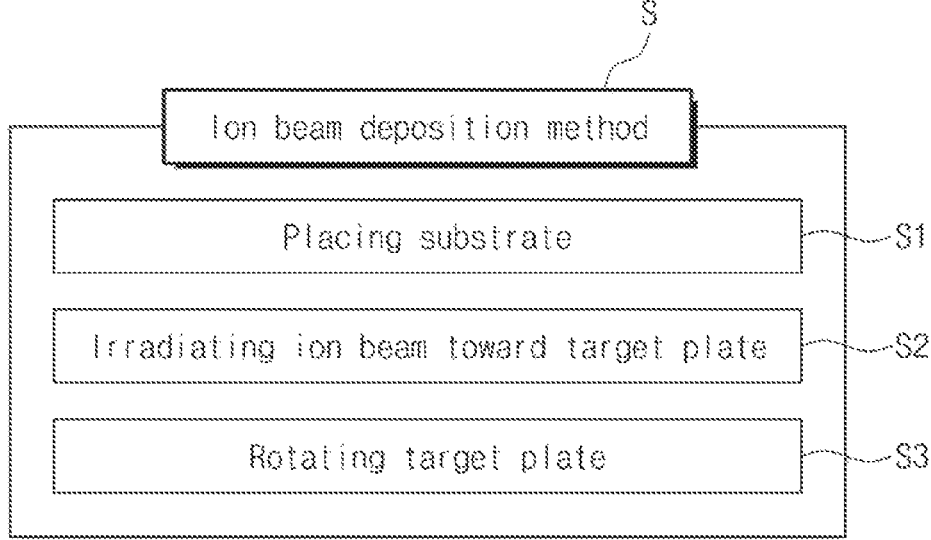
FIG. 3 illustrates a flow chart showing an ion beam deposition method according to example embodiments

FIG. 3 illustrates a flow chart showing an ion beam deposition method according to example embodiments.

Referring to FIG. 3, an ion beam deposition method S may be provided. The ion beam deposition method S may be a way of forming a deposition layer on a substrate by using the ion beam deposition apparatus (see A of FIG. 1) discussed with reference to FIGS. 1 and 2. The ion beam deposition method S may include a step S1 of placing a substrate, a step S2 of irradiating an ion beam toward a target plate, and a step S3 of rotating the target plate.

The ion beam deposition method S of FIG. 3 will be discussed below with reference to FIGS. 4 to 6.

Figure 4:
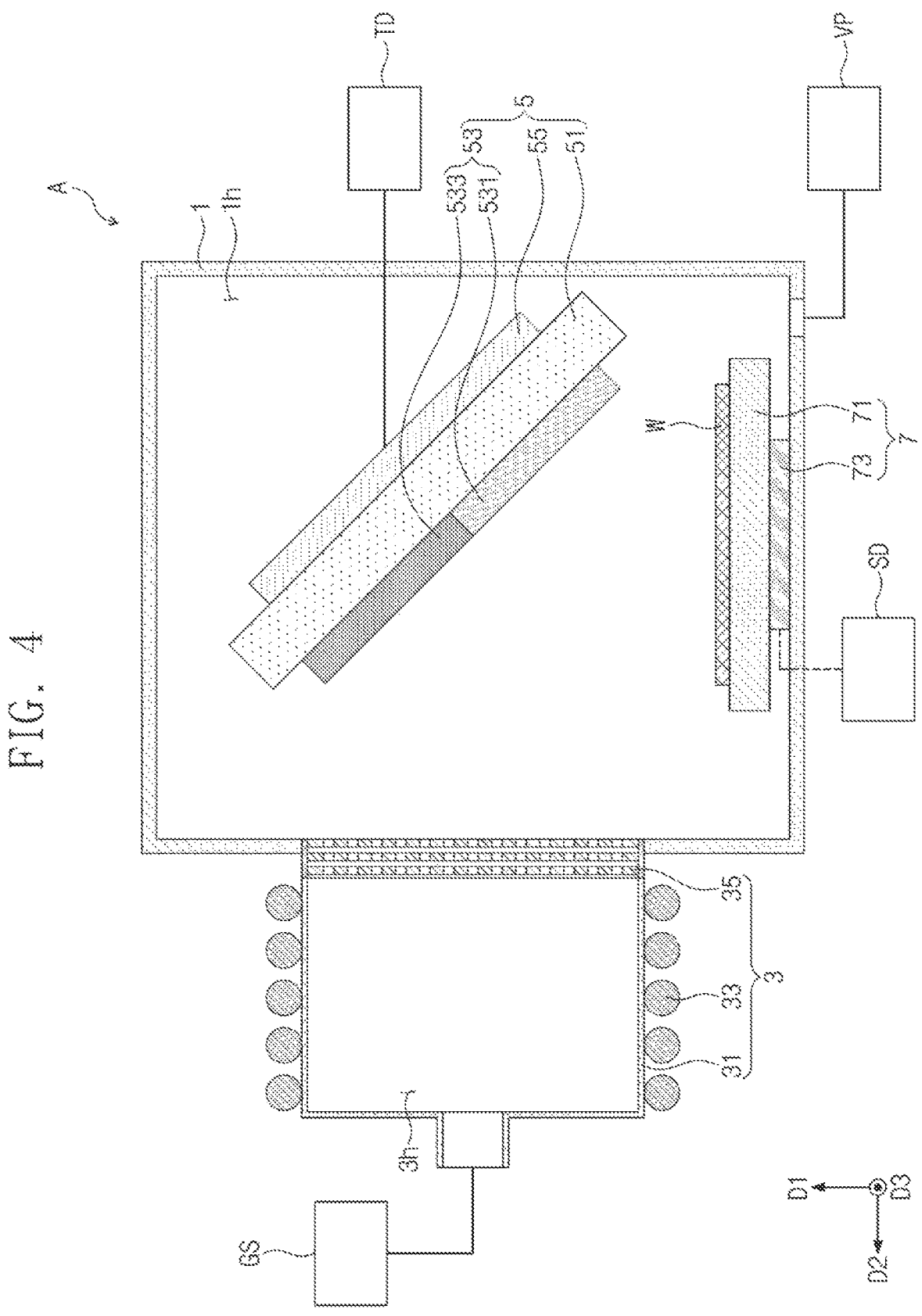
FIGS. 4 and 5 illustrate cross-sectional views showing an ion beam deposition method according to the flow chart of FIG. 3.
Figure 5:
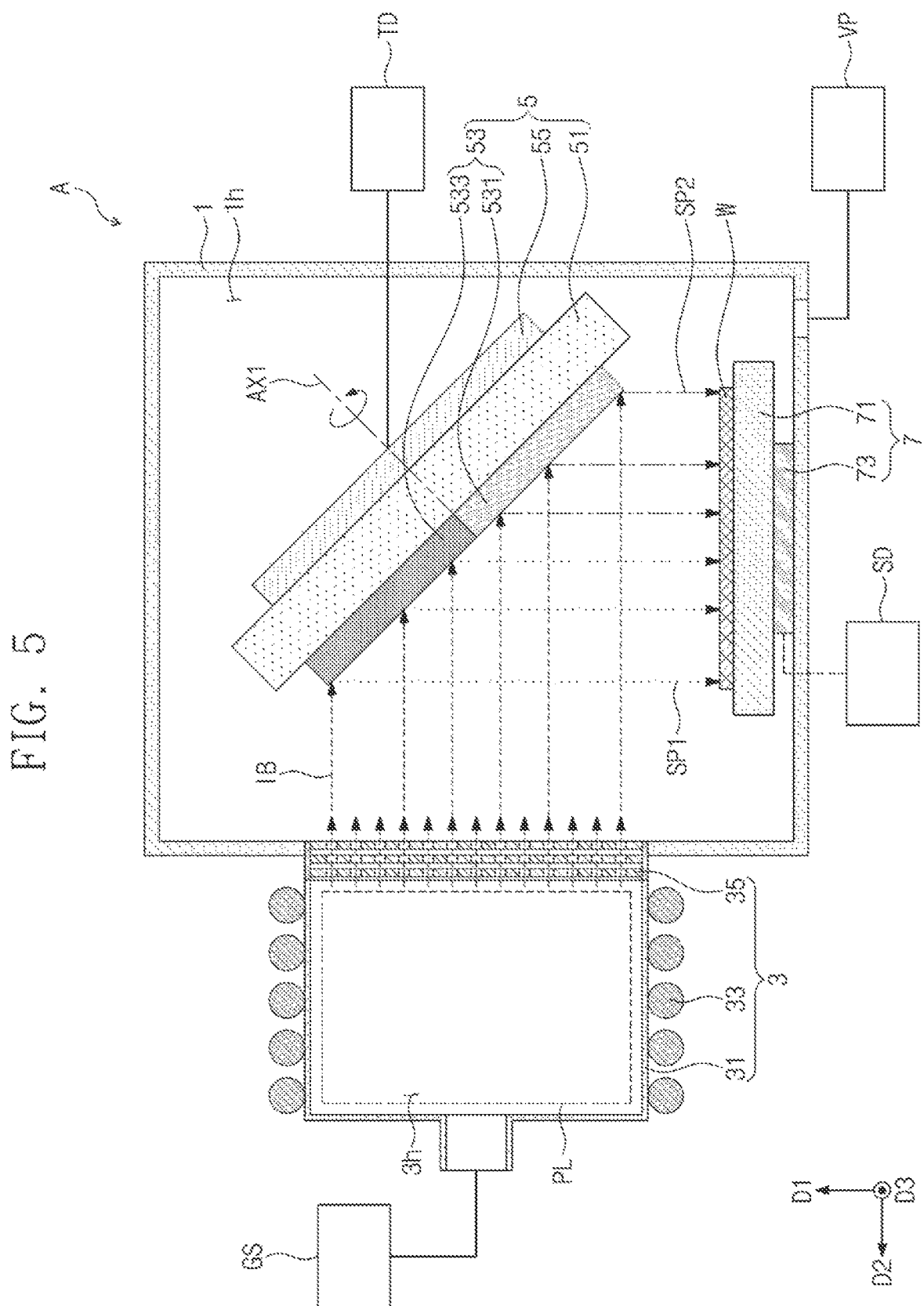

FIGS. 4 and 5 illustrate cross-sectional views showing an ion beam deposition method according to the flow chart of FIG. 3.

Referring to FIGS. 3 and 4, the substrate placement step S1 may include a placing a substrate W into the ion beam deposition apparatus A. For example, the substrate W may be disposed on the substrate holder 71.

Referring to FIGS. 3 and 5, the ion beam irradiation step S2 may include irradiating the target plate 53 with an ion beam IB generated from the ion beam source 3. A gas supplied from the gas supply GS to the plasma generation space 3h may be converted into a plasma PL by the plasma generator 33. Thus, the plasma PL may be generated in the plasma chamber 31.

A portion of the plasma PL in the plasma chamber 31 may be extracted through the grid 35 to the process space 1h. The ion beam IB may thus be formed. The ion beam IB may be irradiated to the target plate 53.

The ion beam IB irradiated to the target plate 53 may sputter a target material from the target plate 53. For example, the ion beam IB may sputter a first material from the first region 531. The first material sputtered from the first region 531 may be called a first sputtering beam SP1. The first sputtering beam SP1 may move onto the substrate W. Therefore, the first material may be deposited on the substrate W.

In addition, the ion beam IB may sputter a second material from the second region 533. The second material sputtered from the second region 533 may be called a second sputtering beam SP2. The second sputtering beam SP2 may move onto the substrate W. Therefore, the second material may be deposited on the substrate W.

In such a way, a plurality of materials may be sputtered from a plurality of regions of the target plate 53. Each of the plurality of sputtered materials may be deposited on the substrate W. For example, a deposition including a plurality of materials may be formed on the substrate W.

In some example embodiments, the ion beam irradiation step S2 may include simultaneously irradiating the ion beam IB on to each of the first region 531 and the second region 533. For example, the ion beam IB may be simultaneously irradiated from the ion beam source 3 toward an entire region of the target plate 53. Therefore, the first sputtering beam SP1 and the second sputtering beam SP2 may be created at the same time. Example embodiments, however, are not limited thereto, and the ion beam IB may be irradiated to a portion of the target plate 53 or to portions of the target plate 53 sequentially.

The target plate rotation step S3 may be performed at substantially the same time as the ion beam irradiation step S2. For example, the target plate 53 may turn while the ion beam IB is irradiated to the target plate 53. The target plate 53 may turn about a first axis AX1. For example, the target driver TD and/or the target holder rotating device 55 may drive the target plate 53 to rotate about the first axis AX1. Therefore, the first sputtering beam SP1 sputtered from the first region 531 may reach an entire region of the substrate W.

In addition, the second sputtering beam SP2 sputtered from the second region 533 may reach an entire region of the substrate W. Therefore, a plurality of materials may uniformly reach the substrate W. Accordingly, a single deposition layer including an uniform compound may be formed on the substrate W.

In some embodiments, the target plate rotation step S3 may include changing a rotation speed of the target plate 53. For example, while the ion beam IB is irradiated to the target plate 53, the target plate 53 may have an increased or reduced rotation speed. There may thus be a variation in distribution of a material that reaches the substrate W.

According to an ion beam deposition apparatus and an ion beam deposition method using the same in accordance with example embodiments, a single deposition layer including a plurality of materials may be formed on a substrate. For example, in a single process, a target plate including a plurality of target materials may be used to form on the substrate a deposition layer made of a compound. The process time may then decrease.

According to an ion beam deposition apparatus and an ion beam deposition method using the same in accordance with example embodiments, because the target plate is rotated during a process, a plurality of materials may uniformly reach the substrate. Accordingly, a uniform deposition may be formed.

According to an ion beam deposition apparatus and an ion beam deposition method using the same in accordance with example embodiments, a rotation speed of the target plate may be adjusted to control properties of the deposition layer. For example, when the deposition layer formed on the substrate has abnormal uniformity, the rotation speed of the target plate may be changed to cope with the problem. Therefore, a uniform deposition layer may be formed.

In example embodiments, the steps S1, S2 and S3 may be performed sequentially in order from step S1 to S3. In example embodiments, one or more of the steps, or parts of the steps, S1 to S3 may be performed simultaneously. For example, the step S2 of irradiating an ion beam toward a target plate may partially or fully overlap step S3 of rotating the target plate.

Figure 6:
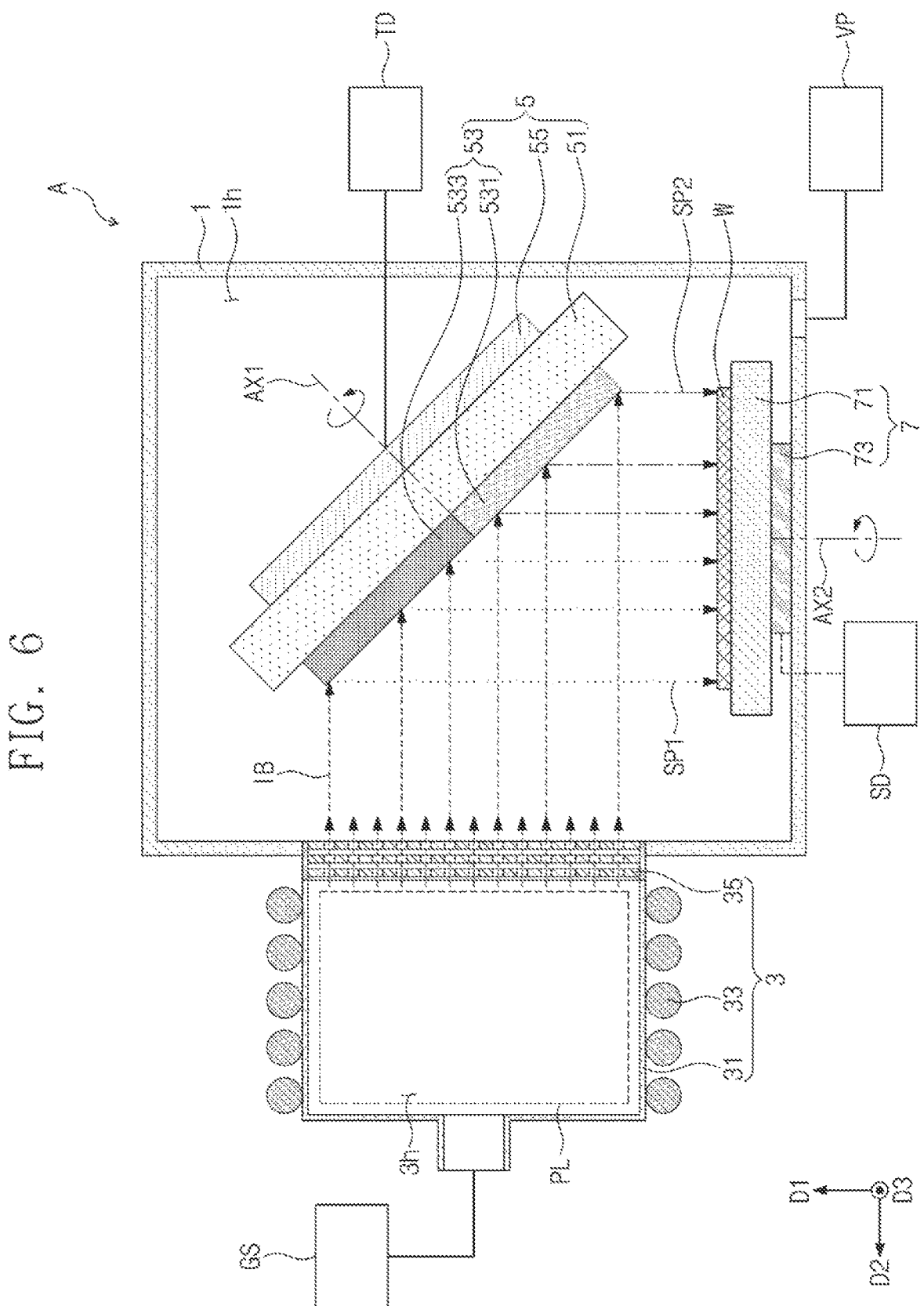
FIG. 6 illustrates a cross-sectional view showing an ion beam deposition method according to the flow chart of FIG. 3.

FIG. 6 illustrates a cross-sectional view showing an ion beam deposition method according to the flow chart of FIG. 3.

Referring to FIGS. 3 and 6, the ion beam deposition method S may further include turning the substrate. For example, both of the target plate 53 and the substrate W may turn. The turning of the substrate may be performed at substantially the same time as the ion beam irradiation step S2. For example, the substrate 53 may turn while the ion beam IB is irradiated to the target plate 53. The substrate W may turn about a second axis AX2. For example, the substrate driver SD and/or the substrate holder rotating device 73 may drive the substrate W to rotate about the second axis AX2.

According to an ion beam deposition apparatus and an ion beam deposition method using the same in accordance with example embodiments, it may be possible to rotate a substrate as well as a target plate. Therefore, a plurality of materials may uniformly reach a top surface of the substrate.

Figure 7:
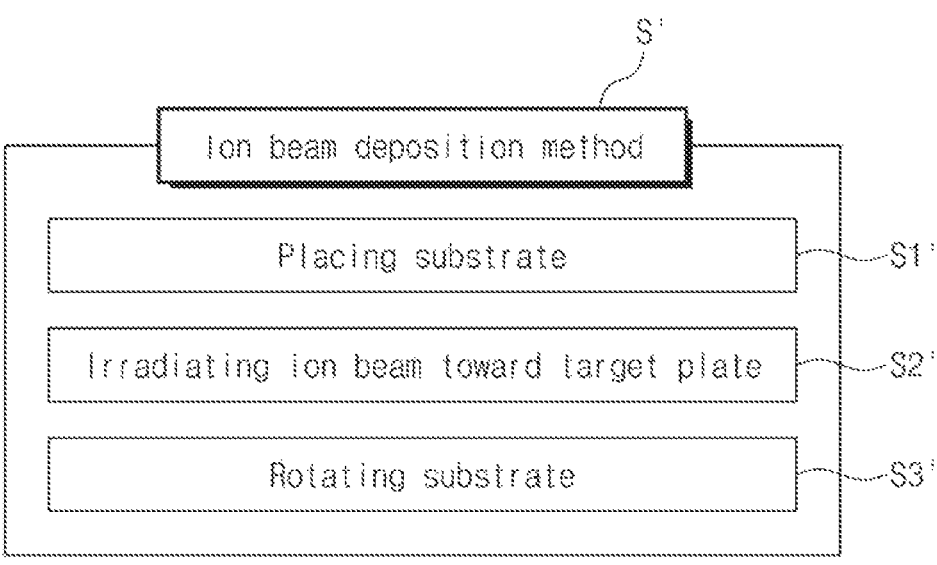
FIG. 7 illustrates a flow chart showing an ion beam deposition method according to example embodiments.

FIG. 7 illustrates a flow chart showing an ion beam deposition method according to example embodiments.

Referring to FIG. 7, an ion beam deposition method S' may be provided. The ion beam deposition method S' may include a step S1' of placing a substrate, a step S2' of irradiating an ion beam toward a target plate, and a step S3' of rotating the substrate.

The substrate placement step S1' and the ion beam irradiation step S2' may be substantially identical or similar to those discussed with reference to FIG. 3.

The ion beam deposition method S' of FIG. 7 will be discussed below with reference to FIG. 8.

Figure 8:
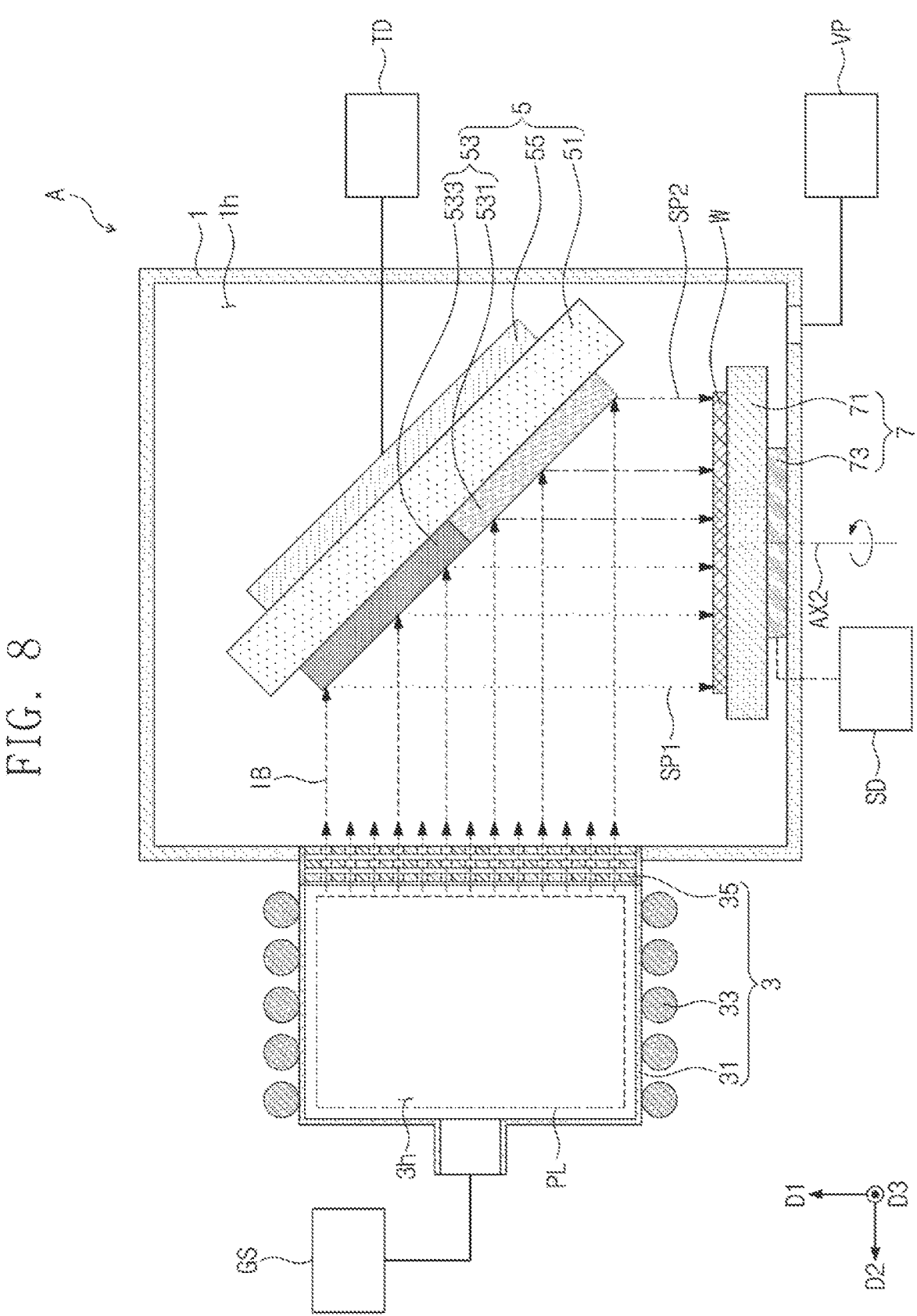
FIG. 8 illustrates a cross-sectional view showing an ion beam deposition method according to the flow chart of FIG. 7.

FIG. 8 illustrates a cross-sectional view showing an ion beam deposition method according to the flow chart of FIG. 7.

The following will omit a description substantially the same as or similar to that discussed with reference to FIGS. 1 to 6.

Referring to FIG. 8, the ion beam irradiation step S2' may include irradiating the ion beam IB to at least a portion of the first region 531 and at least a portion of the second region 533. For example, the ion beam IB may be simultaneously irradiated from the ion beam source 3 toward an entire region of the target plate 53. Therefore, the first sputtering beam SP1 and the second sputtering beam SP2 may be produced at the same time.

The substrate rotation step S3' may be performed at substantially the same time with the ion beam irradiation step S2'. For example, the substrate W may turn while the ion beam IB is irradiated to the target plate 53. The substrate W may turn about the second axis AX2. For example, the substrate driver SD and/or the substrate holder rotating device 73 may drive the substrate W to rotate about the second axis AX2. In this case, the target plate 53 may not turn. For example, while the ion beam IB is irradiated and the substrate W is turned, the target plate 53 may be stationary without rotating. Because the substrate W rotates even though the target plate 53 is stationary, the first sputtering beam SP1 sputtered from the first region 531 may reach an entire region of the substrate W.

In addition, the second sputtering beam SP2 sputtered from the second region 533 may reach an entire region of the substrate W. Therefore, a plurality of materials may uniformly reach the substrate W. Accordingly, a single deposition layer including an uniform compound may be formed on the substrate W. Example embodiments, however, are not limited thereto, and the target plate 53 may rotate According to an ion beam deposition apparatus and an ion beam deposition method using the same in accordance with example embodiments, even though a target plate is stationary without rotating, when a substrate is turned, a plurality of materials may uniformly reach a wide region of the substrate. Therefore, a uniform deposition layer may be formed.

Figure 9:
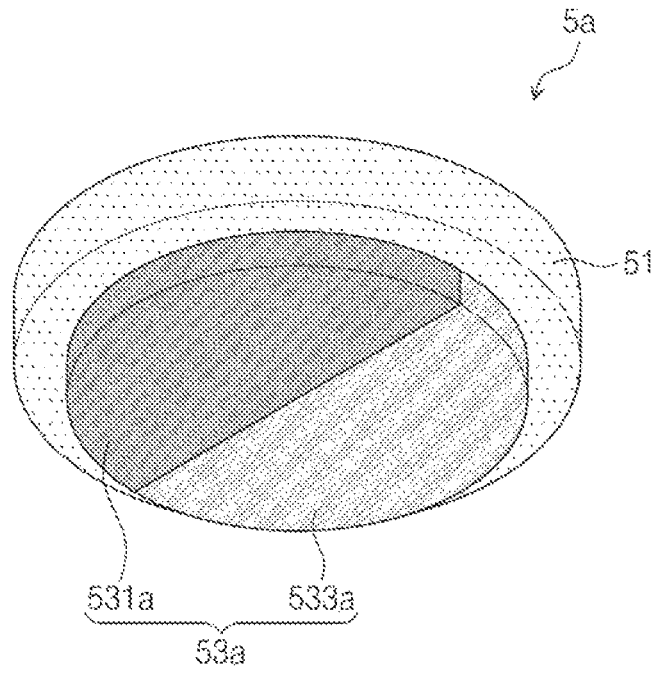
FIG. 9 illustrates a perspective view showing a target part according to example embodiments.

FIG. 9 illustrates a perspective view showing a target part according to example embodiments.

Referring to FIG. 9, a target part 5a may include a target plate 53a. The target plate 53a may include a first region 531a and a second region 533a. For example, the target plate 53a may include two materials.

Figure 10:
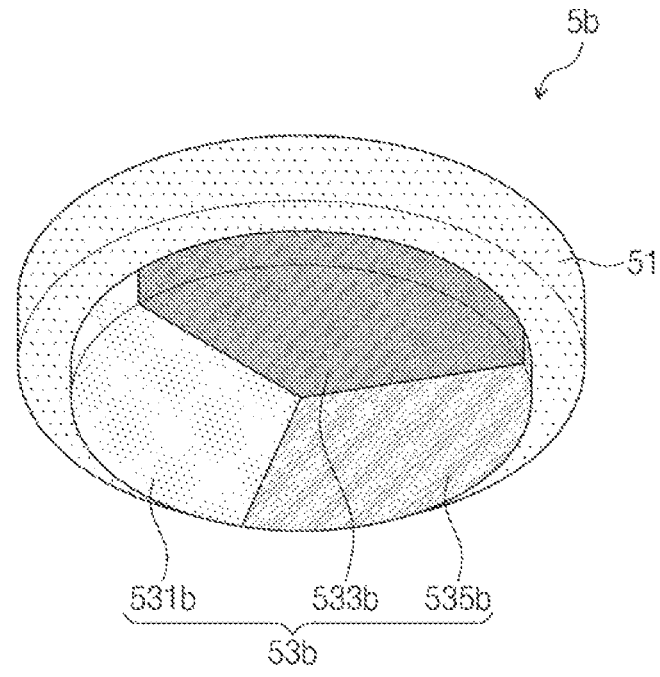
FIG. 10 illustrates a perspective view showing a target part according to example embodiments.

FIG. 10 illustrates a perspective view showing a target part according to example embodiments.

Referring to FIG. 10, a target part 5b may include a target plate 53b. The target plate 53b may include a first region 531*b*, a second region 533*b*, and a third region 535*b*. For example, the target plate 53*b* may include three materials.

Figure 11:
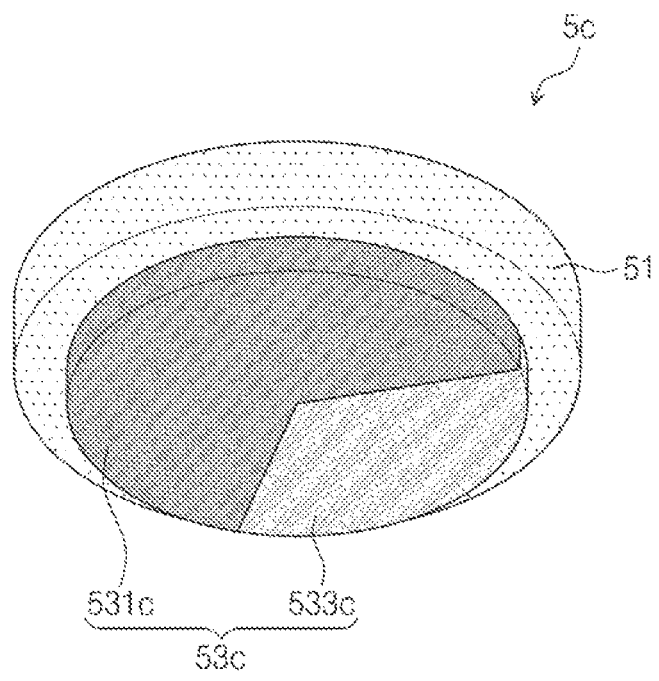
FIG. 11 illustrates a perspective view showing a target part according to example embodiments.

FIG. 11 illustrates a perspective view showing a target part according to example embodiments.

Referring to FIG. 11, a target part 5*c* may include a target plate 53*c*. The target plate 53*c* may include a first region 531*c* and a second region 533*c*. For example, the target plate 53*c* may include two materials. In addition, an area of the first region 531*c* may be different from that of the second region 533*c*. For example, as shown in FIG. 11, an area of the first region 531*c* may be greater than that of the second region 533*c*. In this case, each of the first region 531*c* and the second region 533*c* may have a fan shape. For example, the first region 531*c* may have a fan shape whose central angle is greater than that of a fan shape of the second region 533*c*. Example embodiments, however, are not limited thereto.

According to an ion beam deposition apparatus and an ion beam deposition method using the same in accordance with example embodiments, a target plate may include a plurality of materials, and the plurality of material may be provided in different amounts from each other. For example, in an example embodiment, there may be more of one of the plurality of materials than other of the plurality of materials. Therefore, the materials may have different proportions in a single deposition layer formed on a substrate. For example, compositional ratios of the materials included in the single deposition layer may be changed by adjusting area ratios of regions of the target plate. The target plate structured above may form a variously shaped deposition layer on the substrate.

Figure 12:
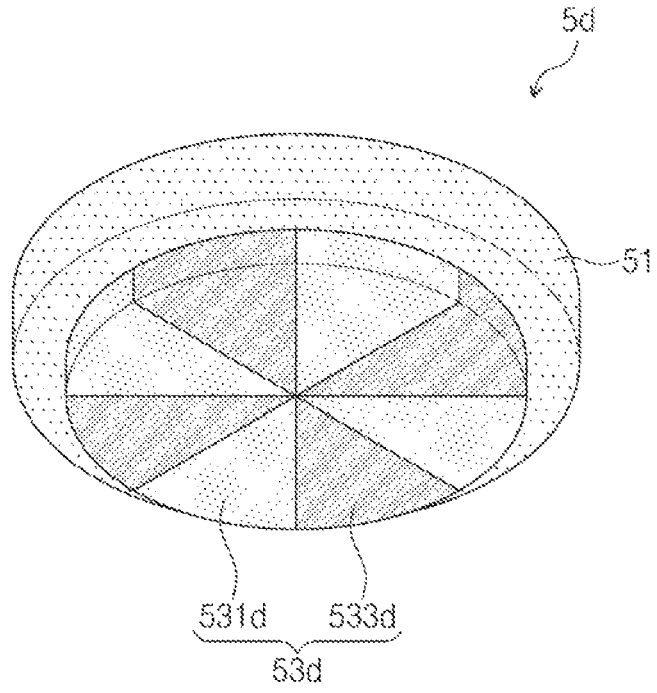
FIG. 12 illustrates a perspective view showing a target part according to example embodiments.

FIG. 12 illustrates a perspective view showing a target part according to example embodiments.

Referring to FIG. 12, a target part 5*d* may include a target plate 53*d*. The target plate 53*d* may include a first region 531*d* and a second region 533*d*. For example, the target plate 53*d* may include two materials. The first region 531*d* may include a first material. The second region 533*d* may include a second material different from the first material. The first region 531*d* may be provided in plural. For example, four first regions 531*d* may be provided as shown in FIG. 12. The second region 533*d* may be provided in plural. For example, four second regions 533*d* may be provided as shown in FIG. 12.

Each of the plurality of the first regions 531*d* and each of the plurality of second regions 533*d* may be alternately disposed along a circumferential direction. Each of the plurality of first regions 531*d* may have a fan shape. Each of the plurality of second regions 533*d* may have a fan shape.

In some embodiments, the plurality of first regions 531*d* may have substantially the same area as that of the plurality of second regions 533*d*. Example embodiments, however, are not limited thereto, and the first and second regions 531*d* and 533*d* may have different areas from each other. A detailed description thereof will be further discussed below with reference to FIG. 13.

According to an ion beam deposition apparatus and an ion beam deposition method using the same in accordance with example embodiments, two materials may be alternately disposed in a circumferential direction. Therefore, a uniform deposition process may be performed on a substrate. In addition, a target plate may increase in the degree of freedom of rotation speed.

Figure 13:
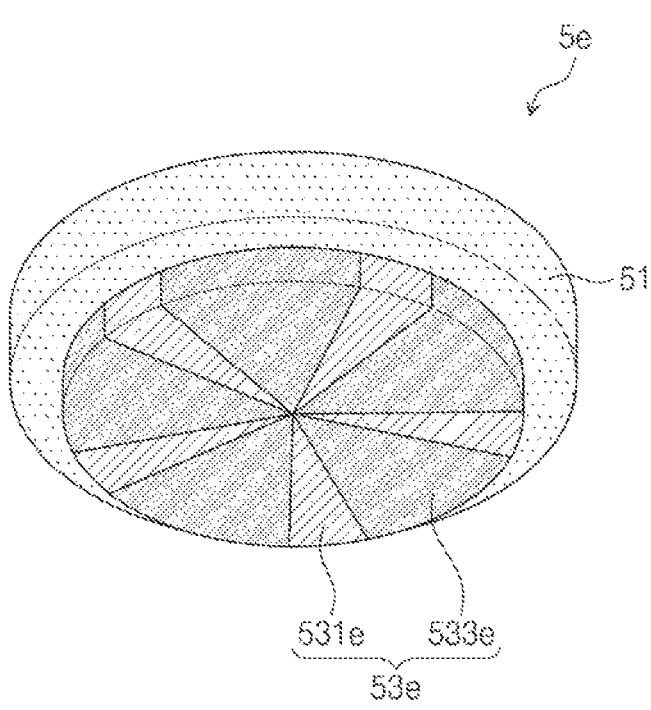
FIG. 13 illustrates a perspective view showing a target part according to example embodiments.

FIG. 13 illustrates a perspective view showing a target part according to example embodiments.

Referring to FIG. 13, a target part 5*e* may include a target plate 53*e*. The target plate 53*e* may include a first region 531*e* and a second region 533*e*. The first region 531*e* may include a first material. The second region 533*e* may include a second material different from the first material. The first region 531*e* may be provided in plural. For example, five first regions 531*e* may be provided as shown in FIG. 13. The second region 533*e* may be provided in plural. For example, five second regions 533*e* may be provided as shown in FIG. 13.

Each of the plurality of the first regions 531*e* and each of the plurality of second regions 533*e* may be alternately disposed along a circumferential direction. Each of the plurality of first regions 531*e* may have a fan shape. Each of the plurality of second regions 533*e* may have a fan shape.

Unlike that discussed with reference to FIG. 12, example embodiments may include at least one of the plurality of first regions 531*e* may having an area different from that of each of the plurality of second regions 533*e*. For example, as shown in FIG. 13, an area of each of the plurality of first region 531*e* may be greater than that of each of the plurality of second regions 533*e*. FIG. 13 depicts that the plurality of first regions 531*e* have the same area, but example embodiments are not limited thereto.

According to an ion beam deposition apparatus and an ion beam deposition method using the same in accordance with example embodiments, two materials may be alternately disposed in a circumferential direction. In this case, a target plate may have regions whose areas are different from each other. Therefore, a variously shaped deposition layer may be formed on a substrate.

According to example embodiments, an ion beam deposition apparatus and an ion beam deposition method using the same, it may be possible to form a single deposition layer including a plurality of materials.

According to example embodiments, an ion beam deposition apparatus and an ion beam deposition method using the same, it may be possible to form a deposition layer made of a compound.

According to example embodiments, an ion beam deposition apparatus and an ion beam deposition method using the same, it may be possible to form a uniform deposition layer.

According to example embodiments, an ion beam deposition apparatus and an ion beam deposition method using the same, it may be possible to reduce process time.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. An ion beam deposition method comprising:

placing a substrate into an ion beam deposition apparatus;

irradiating an ion beam from an ion beam source toward a target plate; and rotating the target plate during the irradiating the ion beam, wherein the target plate includes a first region that includes a first material and a second region that includes a second material different from the first material, wherein each rotation of the target plate comprises irradiation of each of the first region and the second region by the ion beam, and wherein the rotating the target plate during the irradiating the ion beam comprises changing a rotation speed of the target plate.

2. The ion beam deposition method of claim 1, wherein the irradiating the ion beam toward the target plate comprises:

allowing the ion beam to sputter the first material and the second material from the target plate; and depositing the first material and the second material on the substrate.

3. The ion beam deposition method of claim 2, wherein the depositing the first material and the second material on the substrate-comprises allowing the first material and the second material to form a single deposition layer on the substrate.

4. The ion beam deposition method of claim 1, wherein the irradiating the ion beam toward the target plate comprises simultaneously irradiating the ion beam to the first region and the second region.

5. The ion beam deposition method of claim 1, wherein an area of the first region is different from an area of the second region.

6. The ion beam deposition method of claim 1, wherein each of the first material and the second material comprises at least one of silicon (Si), tungsten (W), cobalt (Co), copper (Cu), aluminum (Al), ruthenium (Ru), molybdenum (Mo), hafnium (Hf), titanium (Ti), lanthanum (La), indium (In), tin (Sn), germanium (Ge), arsenic (As), tellurium (Te), selenium (Se), Praseodymium (Pr), and polyimide.

7. The ion beam deposition method of claim 1, wherein the irradiating the ion beam toward the target plate comprises simultaneously irradiating the ion beam to at least a portion of the first region and at least a portion of the second region.

8. The ion beam deposition method of claim 1, wherein the target plate further comprises a third region comprising a third material different from each of the first material and the second material.

\* \* \* \* \*